United States Patent
Schmidt et al.

(10) Patent No.: US 8,736,026 B2
(45) Date of Patent: May 27, 2014

(54) METHOD OF GENERATING A HOLE OR RECESS OR WELL IN A SUBSTRATE

(75) Inventors: Christian Schmidt, Le Bouveret (CH); Leander Dittmann, Lausanne (CH)

(73) Assignee: picoDrill SA, Lausanne (CH)

( * ) Notice: Subject to any disclaimer, the term of this patent is extended or adjusted under 35 U.S.C. 154(b) by 0 days.

(21) Appl. No.: 13/203,492

(22) PCT Filed: Mar. 1, 2010

(86) PCT No.: PCT/EP2010/001249
§ 371 (c)(1),
(2), (4) Date: Aug. 26, 2011

(87) PCT Pub. No.: WO2011/038788
PCT Pub. Date: Apr. 7, 2011

(65) Prior Publication Data
US 2011/0304023 A1 Dec. 15, 2011

Related U.S. Application Data

(60) Provisional application No. 61/156,120, filed on Feb. 27, 2009.

(51) Int. Cl.
*H01L 23/544* (2006.01)
(52) U.S. Cl.
USPC .......... 257/618; 438/629; 438/694; 438/466; 438/710; 438/799
(58) Field of Classification Search
USPC .......... 257/618, 202, 629, E23.179, E21.211
See application file for complete search history.

(56) References Cited

U.S. PATENT DOCUMENTS

| | | | |
|---|---|---|---|
| 2,141,869 | A | 12/1938 | Koenig |
| 2,678,373 | A | 5/1954 | Suran |
| 3,471,597 | A | 10/1969 | Schirmer |
| 3,880,966 | A | 4/1975 | Zimmerman et al. |
| 4,253,010 | A | 2/1981 | Brown et al. |
| 4,931,700 | A | 6/1990 | Reed |
| 5,079,482 | A | 1/1992 | Villecco et al. |
| 6,329,757 | B1 | 12/2001 | Morrisroe et al. |
| 6,362,446 | B1 | 3/2002 | Jones et al. |
| 6,441,341 | B1 | 8/2002 | Steibel et al. |

(Continued)

FOREIGN PATENT DOCUMENTS

| | | |
|---|---|---|
| DE | 971 051 | 12/1958 |
| DE | 10 2007 024700 | 12/2008 |
| EP | 1 163 970 | 12/2001 |
| EP | 1 308 236 | 5/2003 |
| FR | 1 466 335 | 4/1967 |
| WO | 2005 097439 | 10/2005 |
| WO | WO 2005097439 A2 * | 10/2005 |
| WO | 2007 145702 | 12/2007 |
| WO | WO 2009017894 A1 * | 2/2009 |
| WO | WO 2009074338 A1 * | 6/2009 |

OTHER PUBLICATIONS

International Search Report issued Dec. 1, 2010 in PCT/EP10/001249 filed Mar. 1, 2010.

*Primary Examiner* — Chuong A Luu
*Assistant Examiner* — Rodolfo Fortich
(74) *Attorney, Agent, or Firm* — Oblon, Spivak, McClelland, Maier & Neustadt, L.L.P.

(57) ABSTRACT

The present invention relates to a method of generating a hole or recess or well in an electrically insulating or semiconducting substrate, and to a hole or recess or well in a substrate generated by this method. The invention also relates to an array of holes or recesses or wells in a substrate generated by the method. The invention also relates to a device for performing the method according to the present invention.

44 Claims, 11 Drawing Sheets

(56) References Cited

U.S. PATENT DOCUMENTS

Figure 1:
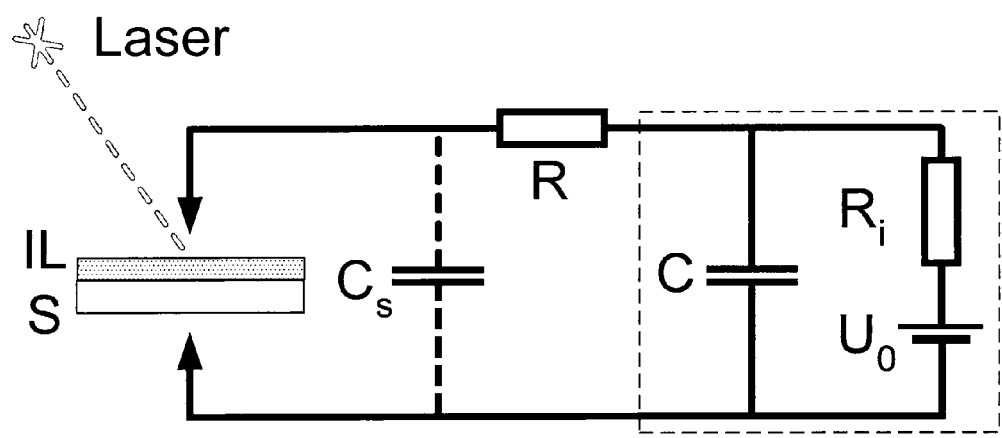

| | | |
|---|---|---|
| 6,758,961 B1 | 7/2004 | Vogel |
| 2002/0190039 A1 | 12/2002 | Steibel et al. |
| 2003/0000927 A1 | 1/2003 | Kanaya et al. |
| 2003/0091432 A1 | 5/2003 | Byrd et al. |
| 2004/0140299 A1 | 7/2004 | Arai et al. |
| 2004/0222196 A1 | 11/2004 | Callies et al. |
| 2006/0027544 A1 | 2/2006 | Pailthorp et al. |
| 2007/0051710 A1 | 3/2007 | Odanaka et al. |
| 2008/0048935 A1 | 2/2008 | Yoshioka et al. |
| 2008/0296273 A1 | 12/2008 | Lei et al. |
| 2009/0153153 A1 | 6/2009 | Vogel et al. |
| 2009/0188901 A1 | 7/2009 | Dantus |
| 2010/0176102 A1 | 7/2010 | Petring et al. |

\* cited by examiner ated with the methods of WO
METHOD OF GENERATING A HOLE OR RECESS OR WELL IN A SUBSTRATE The present invention relates to a method of generating a hole or recess or well in an electrically insulating or semiconducting substrate, and to a hole or recess or well in a substrate generated by this method. The invention also relates to an array of holes or recesses or wells in a substrate generated by the method. The invention also relates to a device for performing the method according to the present invention.

The manufacture of holes, especially of holes having a diameter up to several millimeters, in dielectric substrates using conventional drilling methods, such as mechanical methods or etching methods, is expensive and rather slow. Consequently, the process is not suitable for mass production of such holes as would for example be required for contact regions in solar panels and electronic test equipment.

WO 2005/097439 and PCT/EP2008/009419 disclose methods of generating structures in substrates using the application of voltages to a substrate. The methods disclosed therein do not allow the fast and reliable fabrication of high quality holes which is necessary for industrial productions. Also these methods are sometimes hampered by contamination on the substrate surface due to incomplete ejection of material. Also the holes of these earlier applications, when present in arrays, typically require large distances (typically >1 mm) between adjacent holes to avoid flashovers during production of arrays without insulating layers.

Accordingly there is a need in the art to provide for improved methods allowing the generation of holes in substrates as well as a significant reduction in the pitch, i.e. distance between holes, as e.g. necessary for high density hole arrays.

It was therefore an object of the present invention to provide for a device and method for producing holes in dielectric substrates, wherein the holes have diameters of several tens to hundreds of micrometers. It was a further objective to provide for a device and method for producing holes and arrays thereof, providing a close spacing between adjacent holes in the range of tens to hundreds of micrometer. It was also an object of the present invention to provide for such a method which is easy to perform and which can be adapted to mass production of such perforated substrates.

The objects of the present invention are solved by a method of generating a hole or recess or well in an electrically insulating or semiconducting substrate, comprising the steps:
  a) providing a substrate which is electrically insulating or semiconducting at room temperature,
  b) melting a volume of material of said substrate by heating said volume using a heat source, said volume extending from a first surface of said substrate to a second surface of said substrate, said second surface being opposite said first surface,
  c) removing the molten volume of material resulting from step b) by applying a voltage across said substrate using two electrodes connected to a voltage source and placed at a distance from and on opposite sides of said substrate.

In one embodiment said volume of step b) has a cylindrical shape or pillar-shape or conical shape, and wherein said volume extends from said first surface throughout said substrate to said second surface and has a length which is the thickness of said substrate. In another embodiment, said volume of step b) has a cylindrical shape or pillar shape or conical shape and does not extend fully from said first surface to said second surface, and wherein step c) results in a blind hole, recess or well. The term "cylindrical" shape is meant to also include those shapes where the cross section of such cylinder is not a perfect circle but an ellipse or other rounded shape.

In one embodiment step c) is initiated once said volume of material is molten. For substrates having a thickness ≥150 um, step c) is initiated only during or after step b) is finished, preferably after significant parts or even the entire volume of material is molten. In one embodiment, step c) is initiated at a time interval t from the beginning of step b), which time interval is in the range of from 0 ms to 10 s, preferably 1 ms to 5000 ms, more preferably 10 ms to 3000 ms.

In one embodiment said voltage applied in step c) is a constant or unipolar voltage.

In one embodiment said voltage is applied by applying a DC voltage in the range of from 1 kV to 250 kV. Such voltage may, e.g. be applied using a DC source to which the electrodes are connected.

In one embodiment said voltage is applied for a time period in the range of from 0.1 ms to 10 s, preferably 1 ms to 8000 ms, more preferably 1 ms to 1000 ms.

In one embodiment said voltage is superimposed for all or part of step c) with an alternating (AC) voltage having a frequency >10 kHz, preferably >100 kHz, and more preferably ≥1 MHz.

In one embodiment said heat source is selected from a laser or several lasers, a device being capable of providing an AC voltage at high frequency, such as a high frequency high voltage (AC) source, a Tesla transformer, a heating element, such as a heated filament, a heated electrode, a gas flame or a combination of such heat sources. A device being capable of providing an AC voltage at high frequency is a device which may cause dielectric losses in a substrate or may cause arc formation to and, possibly, through a substrate, if such an AC voltage at high frequency is applied to said substrate. A "high frequency high voltage source" is a voltage source that is providing a high AC voltage at high frequency. As used herein, the term "high voltage" is meant to refer to a voltage amplitude in the range of from 100 V to 100 kV. As used herein, the term "high frequency" is meant to refer to a frequency in the range of from 10 kHz to 1 GHz.

In one embodiment said heat source is a laser.

When the heat source is a laser it is preferred that said laser has a power of 1-10000 W, and, during step b) is operated at a power adapted to the material properties such as melting point and thickness, which may necessitate a reduction in laser power to e.g. ≥60%. In contrast to the methods of WO 2005/097439, it is preferred that said laser is operated such that significant amounts or even the entire volume of material is molten prior to initiation of step c).

In one embodiment said laser emits light which, upon irradiation on said substrate, is capable of penetrating said substrate material and which light, upon irradiation on said substrate, is not being fully absorbed or reflected at a surface of said substrate, but penetrates also in substrate regions underneath said surface.

In one embodiment two lasers beams are used for heating and melting. The two beams are pointed to the opposite sides of the substrate and volume to be molten and removed.

In one embodiment, said laser emits light which, upon irradiation on said substrate, is fully or nearly fully (>90%) absorbed at a substrate surface, and wherein said volume of material is heated by internal heat conduction.

In another embodiment, said laser emits light which, upon irradiation on said substrate, is not fully absorbed at a surface of said substrate so as to heat also within the substrate.

In yet another embodiment, said laser emits light which, upon irradiation on said substrate, is only weakly absorbed at a surface of said substrate, preferably <10%, wherein this weak absorbance allows to heat the substrate homogeneously throughout its thickness.

In one embodiment said laser, when emitting light on a surface, has a focal spot having a diameter in the range of from 1 um-15000 um, preferably 10 um-10000 um, more preferably 20 um-5000 um (1 um=1 micrometer=$1\times10^{-6}$ m).

In one embodiment said laser, during step b), irradiates said volume of material of said substrate for a time period of 1 ms to 10 s, preferably 1 ms to 5000 ms, more preferably 2 ms to 3000 ms, even more preferably 3 ms to 1000 ms, and even more preferably 3 ms to 300 ms. In one embodiment, said heat source is a device being capable of providing a high AC voltage at high frequency, e.g. a high frequency high voltage source (HF-HV source), and step b) is performed by application of a high frequency high voltage (AC) across the substrate, said high frequency high voltage being preferably applied using the electrodes used in step c). In one embodiment, said high frequency high voltage has an amplitude in the range of from 100 V to 100 kV, preferably from 500 V to 50 kV, more preferably from 1 kV to 25 kV, and said high frequency high voltage has a frequency in the range of from 10 kHz to 1 GHz, preferably from 50 kHz to 100 MHz, more preferably from 100 kHz to 50 MHz, and said high frequency high voltage is applied for a time period in the range of from 0.1 ms to 5 s, preferably from 0.1 ms to 1 s, more preferably from 0.5 ms to 500 ms, even more preferably from 1 ms to 100 ms. Melting of the substrate may, in such an embodiment, occur due to electric arc formation and/or dielectric losses in the substrate. In one embodiment, step b) comprises a first substep b1) and a second substep b2), wherein, in substep b2), said high frequency high voltage is applied, as defined above, across the substrate at a region of said substrate, wherein, in substep b1), said region is defined by pre-heating said region, e.g. by applying a laser pulse to said region. The laser pulse has a focus which defines the region. In one embodiment, said pre-heating occurs for a time period in the range of from 0.1 ms to 100 ms, preferably from 0.2 ms to 10 ms. In one embodiment, substeps b1) and b2) overlap by 0.001 ms to 100 ms, preferably 0.01 ms to 50 ms, and more preferably from 0.1 ms to 10 ms. In one embodiment, step c) comprises a first substep c1) and a second substep c2), wherein, in substep c2), said DC voltage is applied, as defined above, to the substrate at a region of said substrate, and wherein in substep c1), said region is defined by applying a laser pulse to said region. In one embodiment, said laser pulse applied in substep c1) is applied at the same region that has previously been defined in substep b1), for example also by application of a laser pulse. In one embodiment, substep c1) is performed immediately after substep b1) or at a time interval from the end of substep b1) in the range of from 0.1 ms to 5000 ms, preferably 0.1 ms to 1000 ms, more preferably 0.1 ms to 300 ms. In one embodiment, substep c2) is initiated upon detection of an increase in current across the substrate, a decrease of voltage amplitude across the substrate, an increase of output current of the high frequency high voltage source, an increase of input current to the high frequency high voltage source or a decrease of output voltage of the high frequency high voltage source. Such detection can, for example, be easily accomplished by measuring the appropriate parameters at the high frequency high voltage source. Timing of the various steps and substeps may be achieved by using a timing and control unit.

In one embodiment said hole or recess or well has a diameter ≥50 um, preferably >100 um, more preferably >150 um.

In one embodiment said hole or recess or well has a diameter ≤15 mm, preferably ≤5 mm.

In one embodiment said hole or recess or well has a diameter in the range of from 50 um to 10 mm, preferably 100 um to 5 mm, more preferably 101 um to 5 um, more preferably 200 um to 3 mm. In one embodiment, said hole or recess or well has a diameter in the range of from 40 um to 400 um, preferably 40 um to 300 um, more preferably 50 um to 300 um.

In one embodiment step c) is initiated at a time interval t after the beginning of step b) which time interval is in the range of from 0 ms to 10 s, preferably 1 ms to 5000 ms, more preferably 3 ms to 3000 ms.

It should be noted, however, that for substrates having a thickness ≥150 um, it is preferred that t≠0 ms, and it is even more preferred, that step c) is initiated only after step b) is run for a significant amount of time such as >10% of its total time—or even after step b) is finished, preferably after significant amounts or the entire volume of material is molten.

In one embodiment said removing of molten volume of material in step c) occurs by electrostatic forces applied through said voltage.

In one embodiment, said removing of molten material occurs or is supported by internal pressure buildup inside the substrate by field induced Joule heating.

In one embodiment heating and melting is achieved upon application of a high frequency (HF) high voltage (HV) across the substrate, preferably using the electrodes used as well for the application of the DC voltage that removes the material. The electric arc forming under these conditions can melt the respective volume.

In a related embodiment, frequency, voltage and duration of this HF voltage determine the diameter of the molten region. Suitable frequencies are between 10 kHz-1 GHz, preferably 50 kHz-100 Mhz, more preferably between 100 kHz-50 Mhz. Voltages are preferably between 100 V-100 kV, more preferably 500 V-50 kV, and more preferably between 1 kV-25 kV. Application times are preferably between 0.1 msec-1000 msec, more preferably 0.5 msec-500 msec and more preferably between 1 msec and 100 msec. As an example, increasing the HF-HV time from 0 to 3 msec increases the hole diameter from 50 to 100 um while all other parameters are kept constant (HF-HV source 4 MHz, ca. 2500 V, laser 3 msec, DC-HV 8 kV, R=33 Ohm, C=5.6 nF, substrate thickness 100 um).

Figure 2:
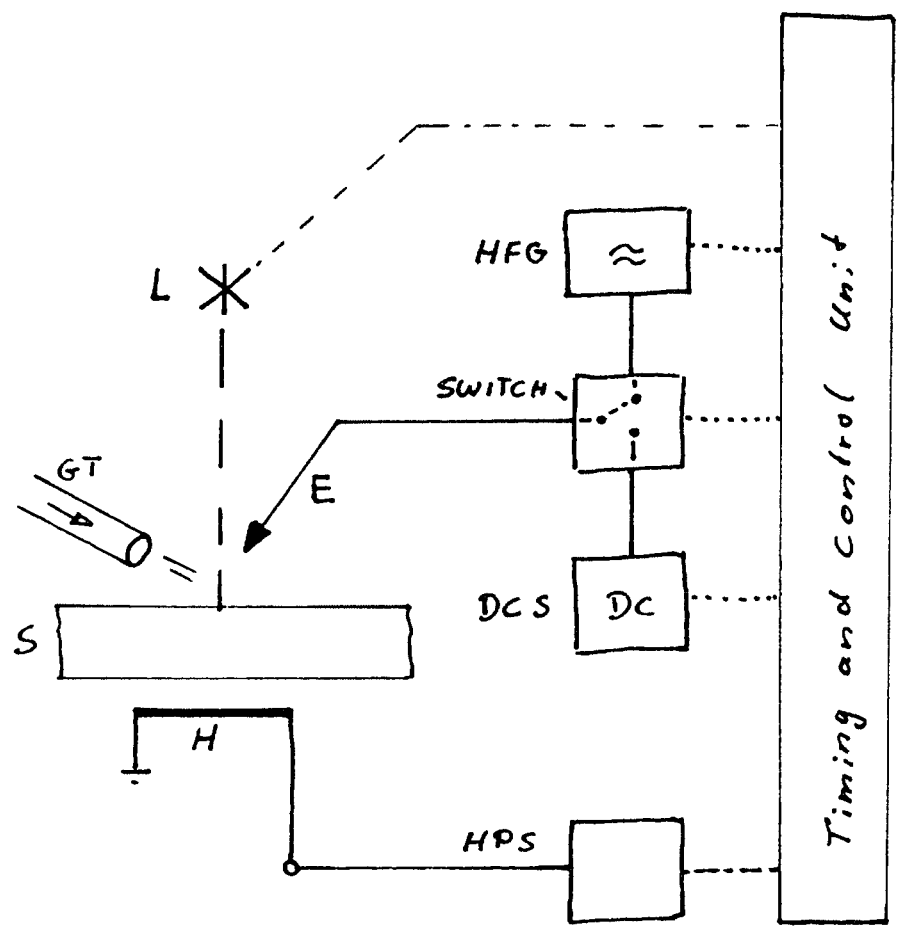

In one typical embodiment, the HF-HV discharge, i.e. the electric arc, is directed towards the region of interest on the substrate, by pre-heating this region (see FIG. 2). Typically, a laser is used for this pre-heating, such as a laser (e.g. 10-250 W CO2) heating the spot for 0.1-100 msec, preferably 0.2-10 msec.

In one embodiment, a pre-heating laser pulse and the HF-HV application overlap by 0.001-100 msec, preferably 0.01-50 msec, more preferably 0.1-10 msec. This overlap provides for small pitches between adjacent holes, such as 0.2 mm for 50 um holes in 500 um thick AF32 glass.

Figure 5:
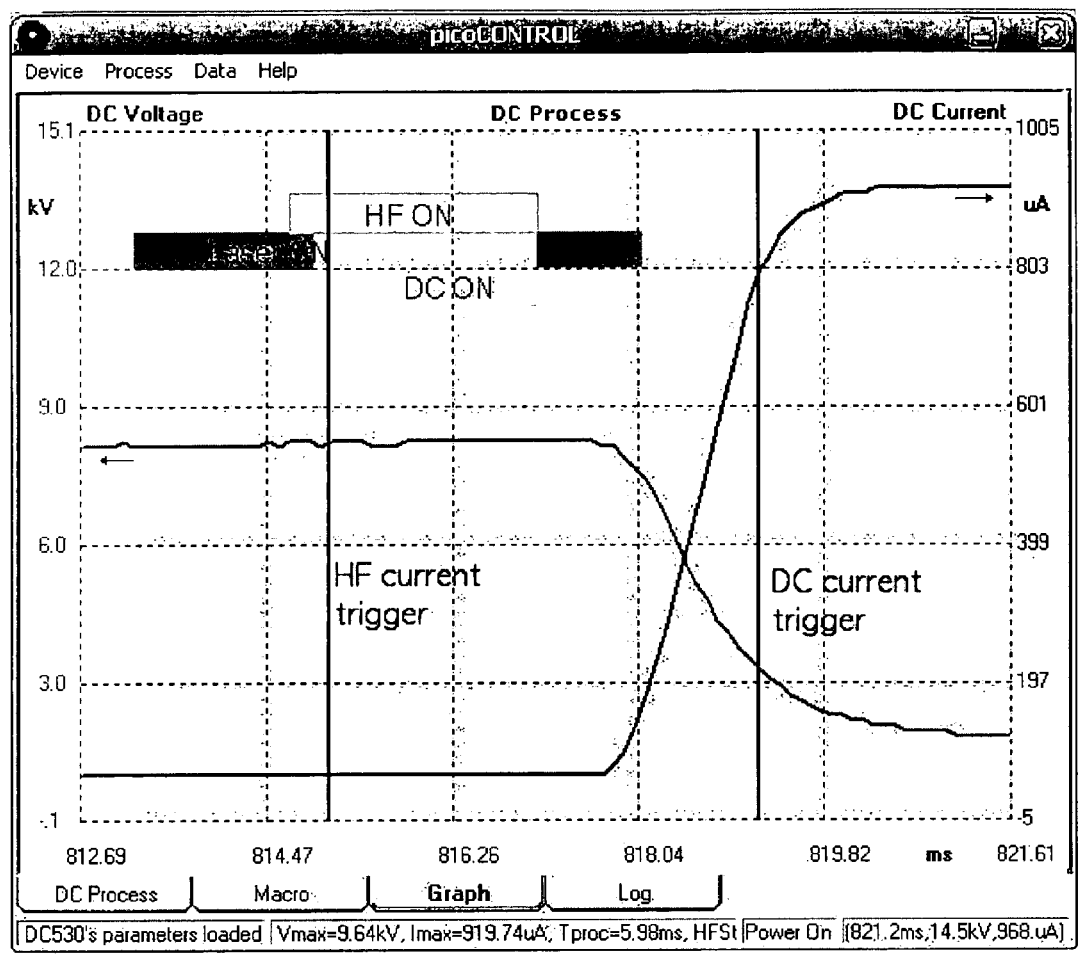

In one embodiment, the laser is employed to (1) guide the HF-HV discharge/arc and (2) the DC HV discharge; this may be timed in such a way as to have two independent laser pulses or it may be combined in one single laser pulse overlapping the onset of the HF-HV discharge as well as the DC HV discharge (see FIG. 5).

In one embodiment, the method according to the present invention comprises:
  a) providing a substrate which is electrically insulating or semiconducting at room temperature,
  b1) pre-heating a region of said substrate where a hole is to be formed, using a heat-source, such as a laser, b2) applying a high frequency high voltage to said region, thereby melting a volume of material of said region, c1) applying a laser pulse at said region, and c2) applying a DC voltage to said region, thereby removing the molten volume of material from said substrate.

In one embodiment, steps b1), b2), c1) and c2) are performed with an overlap between them, with the proviso that b1) is initiated first and step c2) is initiated last.

In one embodiment, the onset of a melting through the entire substrate is detected by analysis of the HF generator properties, such as current consumption (e.g. a sudden increase in current), output current and/or voltage, frequency or phase relationships. This signal is used to trigger the application of the DC HV. Triggering may occur immediately after detection of a molten region extending through the entire substrate thickness or occur with a preset delay, which may be set between 0-1000 msec, preferably 0-100 msec.

A typical embodiment providing the means to apply a DC high voltage as well as a HF HV through a single pair of electrodes consists of a one electrode connected to ground or any other suitable voltage reference point and the other electrode connected to a switch that routes either the DC HV (DC high voltage) or HF HV (high frequency high voltage) or the DC HV superimposed by a HF HV to the electrodes. Working with high frequencies and high voltages makes such switches difficult to design. One possible embodiment consists of a voltage electrode connected to the HF-HV source directly or through a small (0.1-10000 pF) capacitor to the electrode and a the DC high voltage connected through a relay (e.g. >10 kV reed relay) and a spark gap (typically in the range 500-25 000 V, preferred 1000-10 000 V) in series connected to the electrode as well. The spark gap serves mostly the purpose to isolate and to mount the electrode avoiding parasitic discharges of the HF-HV source to surrounding parts as well as discharges through the relay into the DC HV source (see FIG. 3).

In a typical embodiment used to avoid excessive deposition of material removed from the substrate on its surface, a gas stream is used to blow the expelled material away during hole formation. To avoid excessive cooling of the substrate and therefore crack formation, the gas stream can be heated up to several 100° C., such as air heated to 100-800° C.

In one embodiment invented to avoid excessive mechanical tensions during hole formation, in particular during the formation of dense arrays of holes, the reference/ground electrode is either formed or surrounded by another heat source such as a heating filament heating the substrate to a temperature significantly above room temperature, preferably 50-700° C. for glass, more preferably 100-500° C.

In one embodiment said substrate is made of an electrically insulating material selected from glass, quartz, diamond, alumina, sapphire, aluminum nitride, zirconia and spinel, or is made of an electrically semiconducting material selected from elemental silicon, including doped silicon and crystalline silicon, germanium, and compound semiconductors, such as gallium arsenide and indium phosphide.

In one embodiment the durations of said heating in step b) and of said applying an voltage in step c) are determined and user-controlled by a timer-relay or two independent timer-relays, each of said durations being controlled independently of each other, or both being controlled by a trigger device which triggers, i.e. turns off or modulates the heat source and the voltage, upon certain process conditions such as a specified substrate current or temperature, or a threshold substrate current or temperature being reached. In one embodiment the heat source is not fully turned off after hole or recess or well formation in step c), but wherein the heat source is reduced in its heating action so as to modulate the cooling behaviour of the substrate thereby controlling/preventing the formation of thermal stress inside the substrate.

In one embodiment, before, during and/or after performance of step c), a flow of gas which is heated to a temperature in the range of from 100° C. to 800° C. is directed at the substrate at the region where step c) is performed. Such temperature controlled flow of gas, on the one hand, serves to remove from the substrate surface the expelled material that is ejected during hole formation, and on the other hand, helps to avoid thermal stresses within the substrate. In one embodiment, one of the electrodes, such as the ground or reference electrode, is formed or surrounded by a secondary heat source, such as a heating filament, which secondary heat source heats and maintains the substrate at a temperature in the range of from 50° C. to 900° C., preferably from 50° C. to 700° C., and more preferably from 100° C. to 500° C. In a preferred embodiment, such secondary heat source heats and maintains the substrate at a constant temperature in the above-mentioned ranges.

For relatively thin substrates (i.e. preferably <150 um), that is substrates where the timescale of through-heating of the substrate by laser is comparable to the time scale of Joule heating effects, the voltage may be applied before application of the laser. However, the laser energy is chosen such that a sufficiently quick heating of the substrate by laser is ensured. Example: Glass substrate <0.15 mm thickness, voltage 10 kV, electrode distance<5 mm, CO2 laser 25 W at >65% and spot 100-300 um.

In one embodiment said voltage source has a source impedance from 0 to ≤100 MΩ, preferably <10 MOhm and even more preferably <1000 kOhm.

In one embodiment said electrodes are connected to a capacitor having a capacitance from 50-200000 pF, connected to said voltage source.

In one embodiment said substrate has a thickness of from 0.1 mm to 10 mm, preferably a uniform thickness of from 0.1 mm to 7 mm.

A "thick" substrate, as used herein, is a substrate having a, preferably uniform, thickness of ≥150 um.

In one embodiment each of said electrodes are placed at a distance of from 0.2 mm to 25 mm from said substrate.

In one embodiment, during steps b) and/or c), or after step c), said substrate is moved relative to said electrodes and said heat source, e.g. laser, preferably by a defined distance. This allows to extend the hole/recess/well structures such as to e.g. produce lines within the substrate and also allows to weaken or even cut the substrate. It also allows the formation of arrays. Such relative movement may produce a continuous line-like structure in the substrate. As used herein, the term a "continuous line-like structure" may refer to a line-like recess structure, such as a channel along the surface of the substrate, or such term may also refer to a cut within said substrate. This depends to a large extent on the depth of heating/melting during step b).

In one embodiment, said substrate is moved, preferably by a defined distance, relative to said electrodes and said heat source, e.g. laser, after a hole is formed, that is after step c). This is particularly useful for the production of arrays of holes or recesses or blind holes.

Movement of the substrate relative to the electrodes and the heat source may thus also be used to produce arrays of holes. In this instance steps b) and c) are repeated for as many times as holes are to be formed. In this embodiment, after step c), the substrate is moved by a defined distance, and steps b) and c) are repeated again, to generate the next hole or recess or well or blind hole. If steps b) and c) are repeated n times, and the substrate is also moved n times, by a defined distance, this will produce an array of n+1 holes. Depending on the direction of movement, one-dimensional or two-dimensional arrays can be formed.

The objects of the present invention are also solved by a hole or recess or well or line-like structure in a substrate, generated by the method according to the present invention.

The objects of the present invention are also solved by an array of holes or recesses or wells or continuous line-like structures in a substrate, generated by the method according to the present invention, wherein said holes or recesses or wells have a distance between them which is <3 mm, preferably <1.2 mm, more preferably <500 um, even more preferably <300 um, and even more preferably <260 um. Using the method according to the present invention, it has become feasible and possible to generate such arrays at extremely high speed, with the average duration for formation of a single hole to be in the range of a few ms to ca. 100 ms. The pitch, i.e. the distance between the holes in such arrays, can be made surprisingly small without the risk of having electric arc formation to occur through already formed holes. Using the method according to the present invention, the fabrication of arrays of several thousands to hundred thousands of holes has thus become possible.

The objects of the present invention are also solved by a device for performing the method according to the present invention, said device comprising a first electrode and a second electrode, a switch, a high frequency high voltage source, a DC source, a timing and control unit, and a means to hold a substrate, said first electrode being a ground or reference electrode, said second electrode being a voltage electrode for applying a voltage to said substrate, said electrodes being located on opposite sides of said means to hold a substrate, said second electrode being connected to said switch which switch is connected in parallel to said high frequency high voltage source and said DC source, said high frequency high voltage source, said DC source, said switch and said first electrode being connected to said timing and control unit.

In one embodiment, said switch routes DC voltage and/or high frequency AC voltage to said electrodes and comprises a connection for said second electrode to said high frequency high voltage source, either directly or through a capacitor, and comprises a connection for said second electrode to said DC source through a relay and through a spark gap, said relay and said spark gap being connected in series.

In one embodiment, said relay is a reed relay having a switching voltage >10 kV, said spark gap has an ignition voltage in the range of from 500 V-25000 V, preferably 1000 V to 10000 V, and said capacitor, if present, has a capacitance in the range of from 0.1 to 10000 pF.

In one embodiment, the device according to the present invention additionally comprises a heat source, preferably a laser or a heating filament or heating plate, connected to said timing and control unit and being capable of heating a substrate at a defined position, if such substrate is held by said means to hold a substrate.

In one embodiment, the device according to the present invention additionally comprises a means to direct a heated gas flow to a substrate, if present.

In one embodiment, said reference electrode is surrounded by or forms a further heat source, such as a heating filament, which heats the entire substrate or parts of it, if present, to a defined temperature or defined temperature range, wherein such further heat source, preferably, has a heating power supply, and is connected to said timing and control unit, preferably through said heating power supply. In one embodiment, such further heat source is dimensioned such that it heats a substrate area in the range of from 1 mm$^2$ to 1000 mm$^2$. It may, in another embodiment, be dimensioned such that it heats the entire substrate. The overall purpose of such further heat source is to prevent the development of thermal stresses in the substrate. A person skilled in the art knows how to design and dimension e.g. heating filaments or heating plates to heat a defined area of the substrate.

The objects of the present invention are also solved by a high frequency high voltage source, for use in a device according to the present invention, said high frequency high voltage source comprising:
 a Tesla transformer comprising a primary LC circuit and a secondary LC circuit, said LC circuits being coupled, wherein said primary LC circuit has a primary coil which comprises 1-20, preferably 1-10 turns of wire or conductive loops, and said secondary LC circuit has a secondary coil having an inductance in the range of from 10 to 1000 uH, said secondary coil being connected to ground via a resistor
 a comparator
 a MOSFET DRIVER
 a MOSFET,
wherein said comparator is connected to said secondary coil and to said MOSFET DRIVER, and wherein said MOSFET DRIVER is connected to said MOSFET which is connected to the primary LC circuit, such that, during operation, a voltage proportional to the Eigenschwingung of said secondary coil is derived across the resistor and is digitized using said comparator which drives said MOSFET DRIVER, wherein, further, said MOSFET DRIVER drives said MOSFET, thus providing a feedback between said secondary LC circuit and said primary LC circuit and making said primary LC circuit oscillate with the Eigenschwingung of said secondary LC circuit.

As used herein, the term "a volume of material of said substrate" refers to a bulk mass of materials of said substrate. In the context of the present invention, it should be noted that such volume has a length which corresponds to the thickness of the substrate. In preferred embodiments, such volume has a pillar-shape or a cylindrical shape or conical shape and extends from one major surface of this substrate to the other major surface of the substrate located opposite.

In another embodiment, said volume does not extend throughout the substrate, and such volume may also have a cylindrical or conical or pillar shape. The resulting structure after removal of material will be a well or recess or blind hole.

The inventors have surprisingly found that it is possibly to generate relatively large holes or recesses or wells (several 10 um to mm-scale) in a dielectric substrate, such as glass, quartz or silicon. If one melts a region of the substrate, including the surfaces of the substrate, but also the bulk material underneath the surfaces, this molten material can be fully removed by the application of a voltage. The heating can extend throughout the entire thickness of substrate and includes also the interior of a substrate and therefore melts the substrate at a given position throughout the substrate. The heating may also only partially extend within the substrate, in which case, after removal of said material, a well or recess or blind hole is formed.

The inventors have surprisingly found that the generation of holes/recesses on the scale of several 10 um to several millimeters as well as the generation of arrays of such holes/recesses can be achieved by using a heat source, e.g. a laser and/or HF HV induced current flow, and the subsequent application of a voltage. A person skilled in the art knows which laser to choose, in terms of its power and type, given a particular substrate material. For example, with glass as a substrate, a $CO_2$ laser having a power of 25 W and being focussed to a ca. 100-500 um spot has proved useful, with other powers also being possible (1 W-10000 W). Other heating means are, of course, also possible, provided the heat is allowed to penetrate into the substrate, either by direct heating from the heat source or by heat conduction inside the substrate, e.g. if the heating power is mostly absorbed on the substrate surface such as is the case with a CO2 laser beam in glass.

In particular for thick substrates, where a direct heating of the entire volume to remove is not possible, using a laser for through melting appears disadvantageous and other means have to be chosen. The inventors found that a highly efficient heating and melting of small volumes is achieved upon application of a high frequency (e.g. 100 kHz-50 MHz) high voltage (e.g. 1000-20 000 V), preferably between the electrodes otherwise used for the application of the DC HV. Application of this high frequency AC voltage leads to electric arc formation, where the substrate in between acts as the dielectric of a capacitor. The high temperature of the electric arc leads to local melting of the substrate. As the molten material presents only a small electric resistance, the interface between the molten and the still colder substrate material a significant power dissipation occurs at this interface, leading to a quick penetration of the electric arc/molten material into the sample. Even substrates as thick as 4 mm glass can be easily molten through within less than 2 sec. The absence of the need of heat conduction, as for many systems laser—sample material required for through heating, enables this high efficiency.

The molten material is then expelled by application of a DC HV. In one embodiment, heating is therefore achieved by application of a HF voltage, followed with or without overlap by the DC voltage. This can, for example, be achieved by connecting a DC high voltage source and a high frequency Tesla transformer to the electrode using a suitable circuit or switch. Other possible heating means include a heating element, such as a heated filament, a heated electrode, a gas flame.

In accordance with the present invention, a volume of material, as defined further above, is melted using appropriate heating means, and is thereafter removed from the substrate by the application of a DC high voltage. It is important that the application of voltage occurs if an appropriate volume of material of the substrate is molten. "Appropriate" may mean that the volume extends throughout the substrate from one surface to the opposite surface, or it may only be that the volume extends within the substrate from one surface, but does not reach the opposite surface. Hence, depending on the thickness of the substrate, heating may take a time period in the range of from 0 ms to 10 s. Without wishing to be bound by any theory, it is presently believed that the subsequent removal of the molten volume of material occurs by electrostatic forces and pressure buildup inside the substrate to which the voltage seems to significantly contribute, possibly caused by Joule heating.

In an embodiment, where a laser is used, the laser spot size and the laser application time determine the dimensions of the cross section, area on the substrate and depth of the volume of material which is molten. Advantageously for through holes in thick materials (≥150 um), a laser is used which penetrates the substrate material sufficiently, i.e. which is not fully absorbed on the surface of the substrate, such as a CO2 laser for silicon substrates. A person skilled in the art is perfectly able to determine such laser, depending on the type of substrate material chosen. Likewise, the laser wavelength may be adapted to the specific material and the optical, thermal, electrical and material properties thereof.

In terms of the dimensions of the hole that is ultimately generated using the method according to the present invention, this is determined both by the heat source, that is typically laser and/or HF HV source as well as the applied voltage. With respect to the laser, it is more specifically the spot size of the laser as well as the application time which determines the hole size. In terms of the applied voltage, it is more specifically the voltage magnitude and application time of such voltage, which determines the size of the hole. Additionally, the source impedance of the voltage source effects the hole size as well. If one increases the application time of the voltage, a saturation is reached in the sense that beyond a certain application time, for a given material and a given voltage, the hole size does not increase anymore. This is most likely to be due to the fact that, after a certain voltage application time, all the molten material has already been removed. With glass substrates in the range of approximately 100 um to 3 mm thickness, such saturation behavior typically occurs after application of a voltage for several ten ms to several hundred ms.

However, under typical conditions where the DC HV source (=DC source) provides always sufficient energy to expel all molten material from the process region, the most significant effect on the hole diameter comes from the local heat source and the area that is molten by this source. Therefore, time and magnitude of the laser and/or HF HV application determine mostly the hole diameter.

It should be noted that in some embodiments, the substrate may additionally also have an additional insulating layer attached which is heated first, and substrate heating occurs indirectly via the insulating layer.

Application of a voltage occurs by two electrodes placed on opposite sides of the substrate, which electrodes, in one embodiment, are connected to a capacitor which in turn is charged by a voltage source. The source impedance can be defined using an ohmic resistor R. As outlined further above, also the source impedance may have an influence on the hole size, in the sense that the hole diameter is indirectly proportional to the source impedance given a specific application time interval. For consistent results it has been shown advantageous to provide sufficient electrical energy ($CU^2$ and Integral (U*I)dt) to expel all molten material and define the hole diameter by the preceding heating step.

The duration of step b), i.e. heating/melting step can be determined and controlled using a timer-relay/switch or timing and control unit. Likewise, the duration of the application of a voltage can also be user-controlled using a timer-relay/switch or timing and control unit. Both may also be modulated, such as turned off, with and without delay, upon a trigger event generated e.g. once a certain trans-substrate current or substrate temperature is reached. The time after the hole formation may be characterized by using a lower(ing) laser/heating power so as to modulate the cooling process to e.g. avoid thermally induced tensions inside the substrate.

Figure 4:
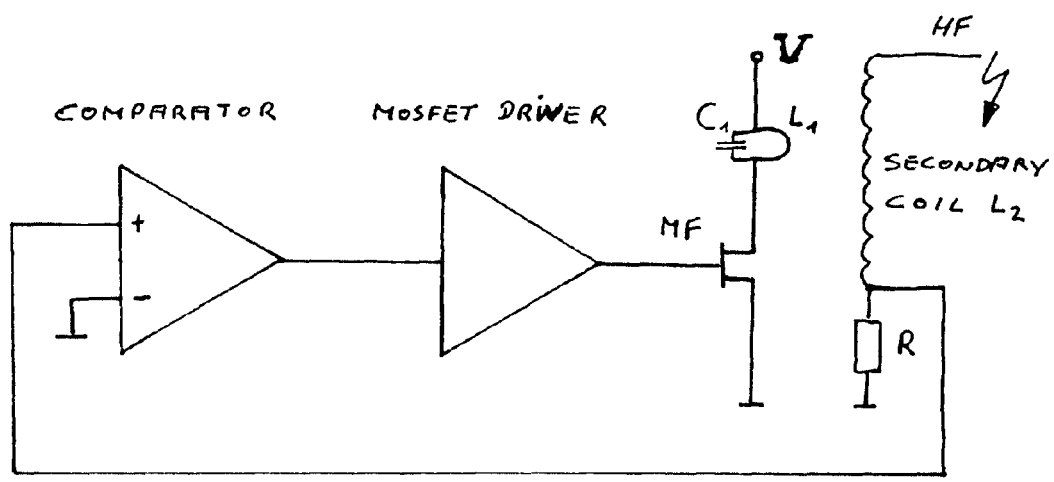

Generally it has been observed to be advantageous for a consistent and reproducible hole formation process to use a precise timing and synchronization circuit (resolution better 1 msec, e.g. based on a micro controller) to control all or part of the components of the embodiments chosen for hole drilling (see FIG. 4).

In the following, reference is made to the figures which are given as preferred embodiments and examples, and which are given to illustrate, not to limit the present invention.

FIG. 1 shows an example of a basic experimental Setup. The substrate S was placed between two electrodes (electrode-substrate gaps distances 0.2-5 mm) connected to a capacitor C (50-200000 pF) charged by a high voltage source.

For thin substrates an additional parasitic capacitance Cs could form across the substrate. The process relevant source impedance was defined by R (Ri being the DC impedance of the actual voltage source). The substrate was locally heated by focussed laser radiation (1-100 W $CO_2$ laser, ≈100-2500 µm focal spot), either directly heating the substrate or indirectly via the insulating layer IL. Upon laser induced melting of the substrate material a voltage was applied between the electrodes causing the molten material out of the substrate. Voltages were typically in the range of 1000-250000 V. To provide immediately the full operating voltage to the electrodes the capacitor C was charged and upon reaching the voltage application time connected to the electrodes via a switch such as a fast reed-relay. The correct moment for voltage/field application can also be determined by measuring the substrate resistance and its change upon laser heating using a (e.g. the same) high voltage supply connected to the electrodes using a high impedance (e.g. 10 GOhm) resistance and measuring the resulting current which is a function of the substrate conductance which again is a function of the substrate temperature.

FIG. 2 shows schematically an experimental setup using a HF HV (high frequency high voltage AC) source for melting and a DC HV (DC high voltage) source for the extraction of the molten material. The process is typically started by defining the process region on the sample S with the laser L (1-100 W $CO_2$ laser, ≈100-2500 µm focal spot) by radiation for a short time to guide the HF HV driven electric arc. Laser and HF HV application overlap typically for a fraction of the melting time. Through melting is usually detected monitoring the properties of the HF HV source HFG (high frequency generator), such as the power consumption. Upon this trigger signal, melting may continue for several milliseconds to further enlarge the resulting hole. After melting has been finished—or slightly before, the DC HV source DCS (DC source) is put on the electrode E using the SWITCH. In order to guide the DC discharge and thus avoid flashovers, a short laser pulse may be applied onto the substrate centering around the onset of the DC application. A suitable timing circuit, such as a microcontroller, controls timing (on/off) of the components. The microcontroller may also be used to set and supervise the output parameters of the individual components, such as laser output power, voltage magnitude.

The heating filament H, which typically covers an area of 100 um^2-400 mm^2, may provide heat during the process to maintain an elevated sample temperature thus avoiding cracking of it due to mechanical tensions forming during the cool down process after hole formation. The temperature of H is set by the power supply HPS (heating power supply). The gas tube GT may provide for a stream of gas, that may also be heated, to avoid and/or remove sample depositions during the process.

Figure 3:
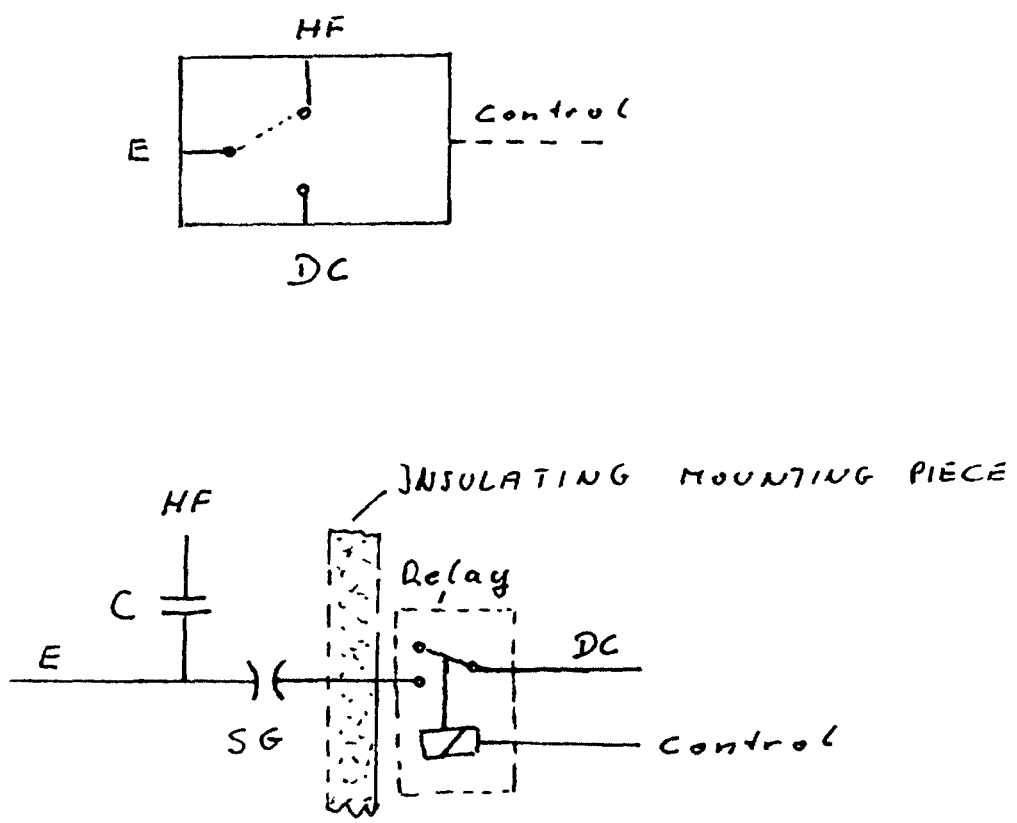

FIG. 3 shows schematically (lower panel) the possible realisation of a high voltage DC-HF switch as shown in FIG. 2 (upper panel). The HF HV source is directly connected to the electrode E. Optionally, a small capacitor C not providing a significant resistance to the HF current may be introduced to decouple the HF HV source from DC voltages put on the electrode. A spark gap SG separates the electrode from the relay and DC HV source, preventing the HF voltage to enter the DC source through the relay when active. The ignition voltage of the spark gap must therefore be higher than the output voltage of the HF HV source. However, choosing a SG ignition voltage smaller than the DC HV voltage allows, upon closing of the HV Relay, the DC HV component to overcome the spark gap and to reach the electrode. Usually, the overlap between the ON time of the HF HV and the ON time of the DC HV is small, ca. 0-10 msec. The HV relay, e.g. a reed relay, is connected to the control circuitry. The spark gap may also serve as a mounting device for the electrode by attaching the end opposite to the HF part to some suitable insulating mechanical base.

FIG. 4 shows schematically a simple HF HV generator suitable as HF HV source. The generator is built as Tesla transformer: two LC circuits are coupled together. The circuit L1C1 drives the secondary circuit L2C2, with C2 being usually the inherent capacitance forming at L2. L1 usually consists of one or a few turn of wire or conductive loops on a printed circuit board (PCB) surrounding (inside or outside possible) the secondary coil, which usually has a diameter between 10-60 mm and an inductance of 10-1000 uH, preferably 25-500 uH. A voltage proportional to the Eigenschwingung of the secondary coil is derived across the resistor R, digitized using the fast COMPARATOR (e.g. AD8561) which drives the MOSFET DRIVER (e.g. DEIC420) which again drives a suitably fast and strong power mosfet MF (e.g IXZ210N50L), thereby making the primary circuit oscillate with the Eigenschwingung of the secondary LC circuit. Primary and secondary LC circuit may be tuned using C1. The output voltage can be controlled adjusting the primary voltage V. Typical frequencies mostly used were between 100 kHz-30 MHz.

FIG. 5 shows a timing and amplitude diagram of a hole formation process in 500 um thick AF32 glass. The process starts by activation of the 25 W CO2 laser (dark grey bar, Laser ON). Shortly thereafter and with a small overlap the HF HV source (4 MHz, ca 4000 V) is activated (medium grey bar, HF ON). The left vertical line (HF current trigger) indicates the onset of the through melting of the substrate, detected by a significant increase in primary HF HV current (not shown). At the same time the DC voltage (light grey bar, DC ON) is routed onto the electrode by switching on the relay (FIG. 2, 3), which occurs with a delay of ca. 2-3 msec due to the inertia of the relay. When the relay finally puts the DC HV on the electrode, the laser is activated a second time to ensure the DC discharge location. During the DC discharge the DC voltage decreases (light grey curve, left scale) and the DC current increases (dark grey curve, right scale). The right vertical line (DC current trigger) indicates the occurrence of the DC discharge detected by a significant increase in DC current. At this time the DC power supply is turned off such that the capacitor C (FIG. 1) discharges. Alternatively, the DC power supply can be turned off with a delay with respect to the DC current trigger time so as to recharge the capacitor and extend the DC discharge time. The HF HV On time was used to control the hole diameter.

Figure 6:
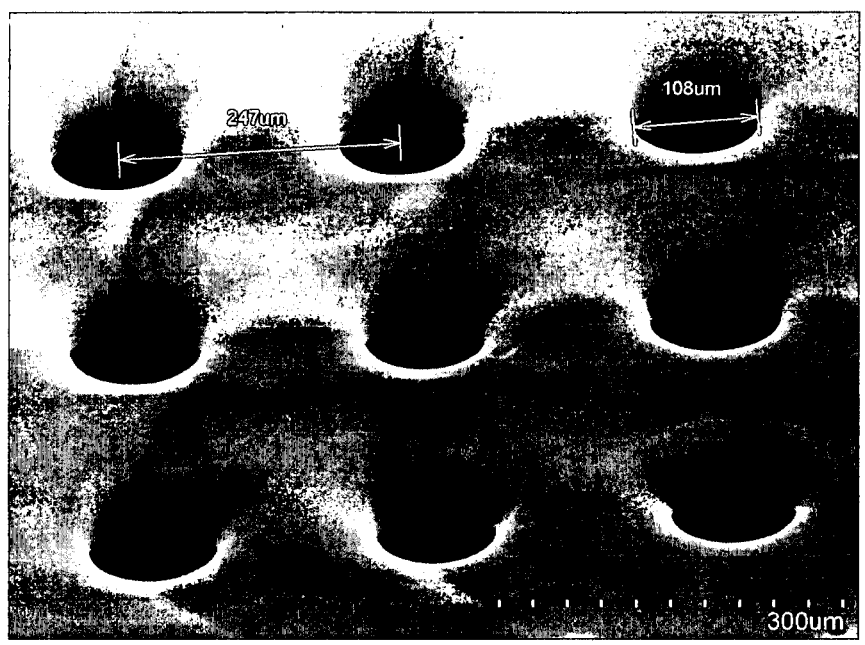
Figure 7:
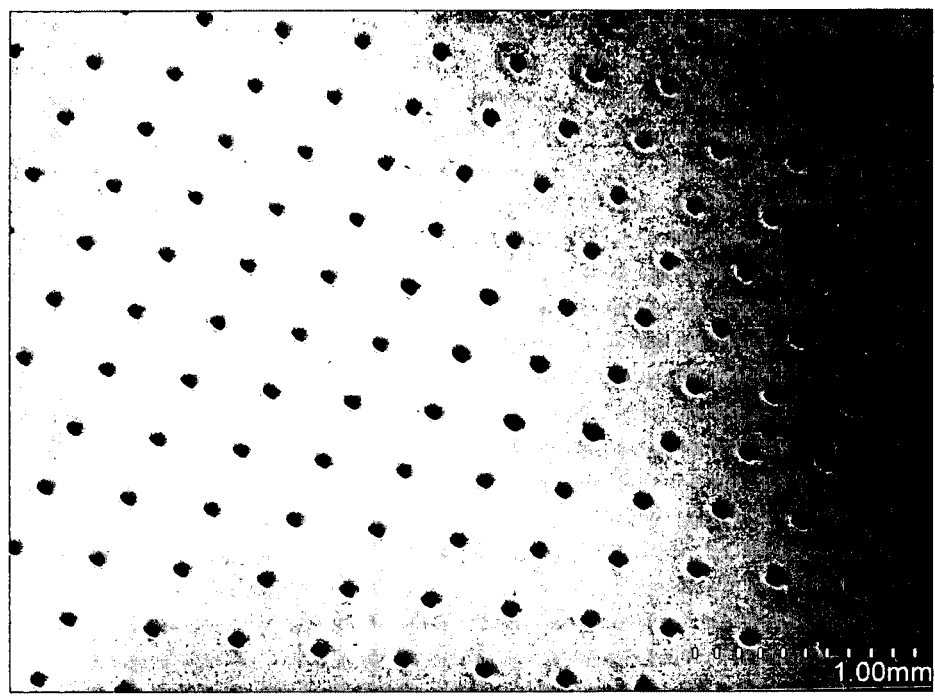

FIG. 6 shows an array of holes in range of 110 um in 100 um thick D263T glass. The pitch of 247 um was achieved with the process described in FIG. 5, DC voltage 1.8 kV, C=5.6 nF, R=100 Ohm, CO2-laser heating at 20 W for 4 msec before DC voltage was switched to electrodes, FIG. 7 shows an array of holes of 100 um diameter with a pitch of 400 um formed in 0.5 mm thick fused silica using a DC voltage of 5 kV, C=5.6 nF, R=100 Ohm, CO2-laser heating at 12 W for 400 msec, voltage was switched to electrodes after 200 msec of heating and kept on for 200 msec.

Figure 8:
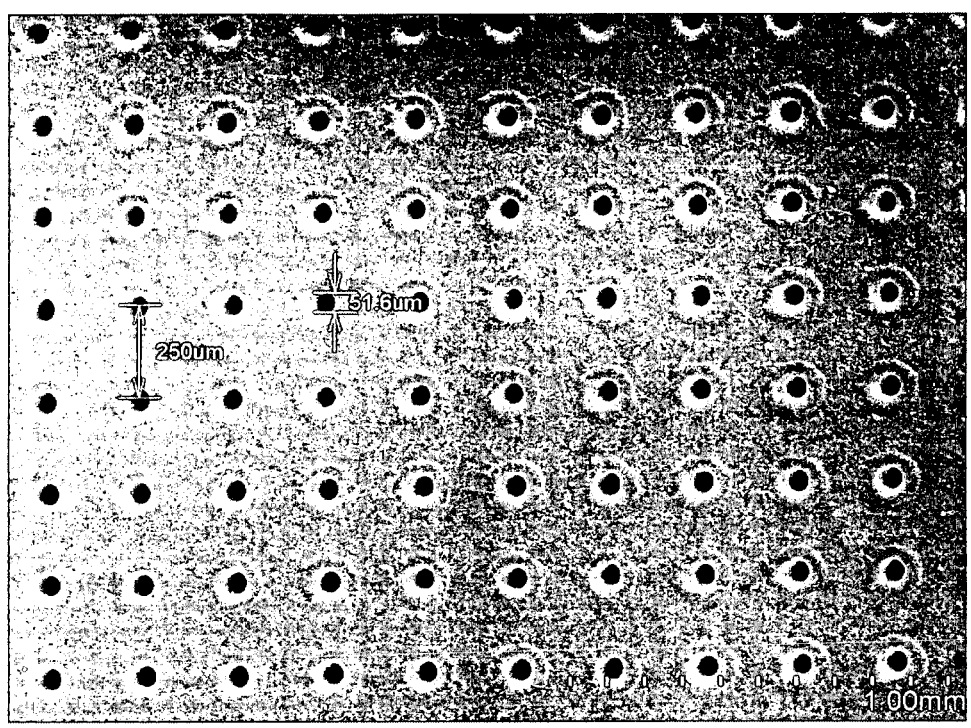

FIG. 8 shows an array of holes of 50 um diameter with a pitch of 250 um formed in 500 um thick AF32 glass. First laser pulse for positioning was 22 W for 2 msec, with an overlap of 0.5 msec the HF heating was applied, 1.9 msec after detection of through melting (by HF current increase) the second laser pulse with 22 W was applied for 1 msec, within this second pulse the DC voltage (10 kV, C=5.6 nF, R=100 Ohm) was switched to the electrodes.

Figure 9:
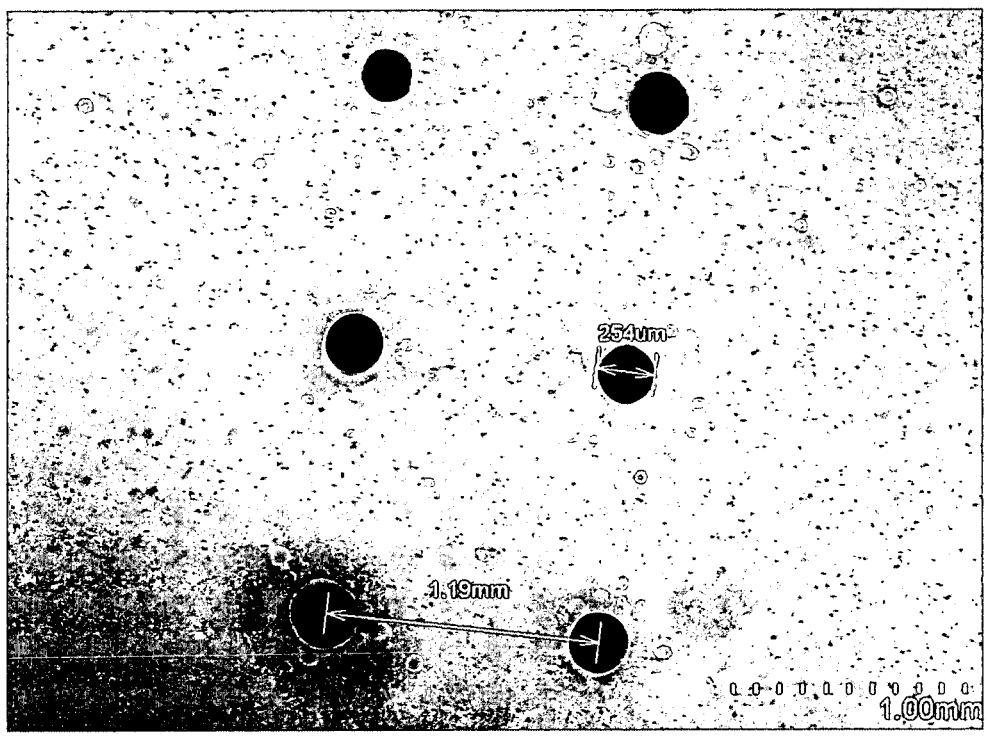
Figure 10:
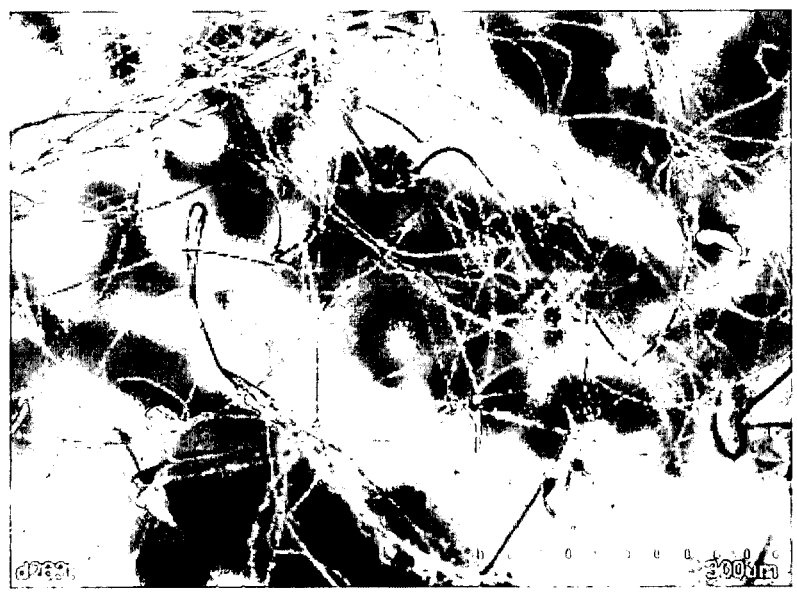

FIG. 9 shows an array of holes of 250 um diameter at a distance of 1.2 mm formed in 0.4 mm thick Mullite (a special glass ceramics). Parameters used were DC voltage of 5 kV, C=11.2 nF, R=0 Ohm, CO2-laser heating with 24 W for 40 msec, the DV voltage was switched to the electrodes in the event of switching off the laser, FIG. 10 shows SEM images of the filamentous structures ejected during the process obtained from a D263T glass substrate sample as shown in FIG. 6.

Figure 11A:
Figure 11B:
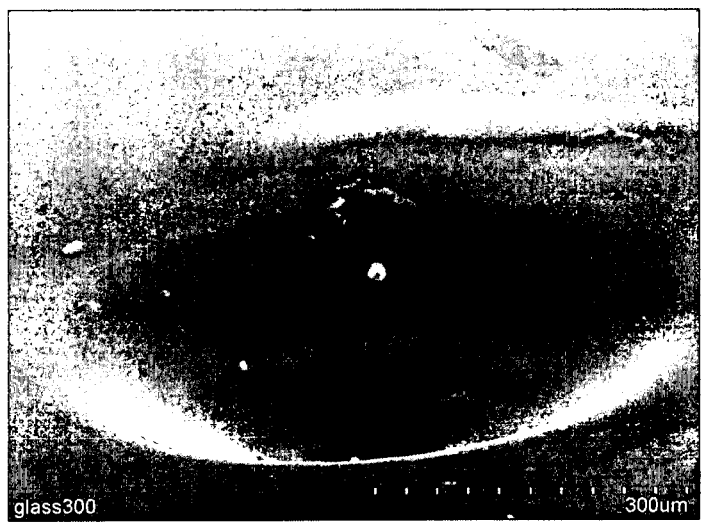

FIG. 11 shows (A) a D263T glass substrate (0.3 mm thickness) with a 0.26 mm diameter hole. Parameter: R=0 Ohm, C=1 nF, laser spotsize ca 250 um, DC voltage of 10000 V was switched to the electrodes after 200 msec of heating with CO2 Laser 25 W/75% and kept on for 400 ms.

(B) SEM image of a blind hole or well, respectively. Schott D263T. 300 um thickness, laser 25 W CO2 at 75% and 300 um spot size. DC voltage=3 kV.

The features of the present invention disclosed in the specification, the claims and/or in the accompanying drawings, may, both separately, and in any combination thereof, be material for realising the invention in various forms thereof.

The invention claimed is:

1. A method of generating a structure in a substrate, comprising the following a) and b) in order:
    a) melting a volume of material of a substrate, which is electrically insulating or semiconducting at room temperature, by heating the volume of material with a heat source to form a molten volume, wherein the volume of material extends fully or partially from a first surface of the substrate to a second surface of the substrate, and the second surface is opposite of the first surface;
    b) removing the molten volume by applying a voltage across the substrate with two electrodes connected to a voltage source and placed at a distance from, and on opposite sides of, the substrate, wherein such removing is initiated once the volume of material is molten,
    thereby generating the structure in the substrate, wherein the structure comprises at least one hole, recess, well, or array thereof,
    wherein said method is suited for generating a structure in a substrate, wherein the structure comprises an array of holes or recesses or wells in a substrate and wherein the holes or recesses or wells have a distance between them which is <500 μm.

2. The method of claim 1, wherein
    the volume of material has a cylindrical shape or pillar-shape or conical shape, and
    the volume of material extends from the first surface through the substrate to the second surface and has a length which is the thickness of the substrate.

3. The method of claim 1, wherein the removing b) is initiated at a time interval from the beginning of the melting a) and the time interval is in the range of from 0 ms to 10 s.

4. The method of claim 1, wherein the voltage is a constant or unipolar voltage.

5. The method of claim 4, wherein the voltage is applied by applying a DC voltage in the range of from 1 kV to 250 kV.

6. The method of claim 1, wherein the voltage is applied for a time period in the range of from 0.1 ms to 10 s.

7. The method of claim 4, wherein the voltage is superimposed for all or part of the removing b) with an alternating (AC) voltage having a frequency >10 kHz.

8. The method of claim 1, wherein the heat source is selected from the group consisting of:
    at least one laser;
    a device capable of providing an AC voltage at high frequency;
    a heating element;
    a heated electrode;
    a gas flame; and
    a combination of such heat sources.

9. The method of claim 8, wherein the heat source is at least one laser.

10. The method of claim 9, wherein the at least one laser has a power of 1-10000 W.

11. The method of claim 9, wherein the at least one laser emits a light which, upon irradiation on the substrate, is capable of penetrating the material of the substrate and which light, upon irradiation on the substrate, is not fully absorbed or reflected at a surface of the substrate, but penetrates in regions underneath the surface of the substrate.

12. The method of claim 9, wherein the at least one laser emits a light, which, upon irradiation on the substrate, is fully absorbed at a surface of the substrate and wherein the volume of material is heated by internal heat conduction.

13. The method of claim 9, wherein the at least one laser, when emitting light on a surface of the substrate, has a focal spot with a diameter in the range of from 1 μm-15000 μm.

14. The method of claim 9, wherein the at least one laser, during the melting a), irradiates the volume of material of the substrate for a time period of 1 ms to 10 s.

15. The method of claim 1, wherein the heat source is a device capable of providing an AC voltage at high frequency, and wherein the melting a) occurs by application of a high frequency high voltage across the substrate, wherein the high frequency high voltage is applied with the two electrodes.

16. The method of claim 15, wherein the high frequency high voltage has an amplitude in the range of from 100 V to 100 kV and the high frequency high voltage has a frequency in the range of from 10 kHz to 1 GHz and wherein the high frequency high voltage is applied for a time period in the range of from 0.1 ms to 5 s.

17. The method of claim 15, wherein the melting a) further comprises:
    a1) defining a region a1) of the substrate by pre-heating the region a1; and
    a2) applying the high frequency high voltage across the substrate at the region a1).

18. The method of claim 17, wherein the pre-heating occurs for a time period in the range of from 0.1 ms to 100 ms.

19. The method of claim 17, wherein the defining region a1) and the applying high frequency high voltage a2) overlap by 0.001 ms to 100 ms.

20. The method of claim 15, wherein the removing b) further comprises:
    b1) defining a region b1) of the substrate by applying a laser pulse to the region b1); and
    b2) applying a DC voltage to the substrate at the region b1) of the substrate.

21. The method of claim 17, wherein the removing b) further comprises:
    b1) defining a region b1) of the substrate by applying a laser pulse to the region c1); and
    b2) applying a DC voltage to the substrate at the region b1) of the substrate.

22. The method of claim 21, wherein the defining b1) is performed immediately after the defining a1) or at a time interval from the end of the defining a1) in the range of from 0.1 ms to 5000 ms.

23. The method of claim 21, wherein the applying a DC voltage b2) is initiated upon detection of an increase in a current across the substrate, a decrease of a voltage amplitude across the substrate, an increase of an output current of the high frequency high voltage source, an increase of an input current to the high frequency high voltage source or a decrease of an output voltage of the high frequency high voltage source.

24. The method of claim 1, wherein the at least one hole or recess or well has a diameter >50 μm.

25. The method of claim 24, wherein the at least one hole or recess or well has a diameter <15 mm.

26. The method of claim 24, wherein the at least one hole or recess or well has a diameter in the range of from 50 μm to 10 mm.

27. The method of claim 1, wherein the substrate comprises at least one electrically insulating material selected from the group consisting of glass, quartz, diamond, alumina, sapphire, aluminum nitride, zirconia and spinel, or comprises at least one electrically semiconducting material selected from the group consisting of:
    elemental silicon, including doped silicon and crystalline silicon;
    germanium; and
    a compound semiconductor.

28. The method of claim 1, wherein a duration of the melting a) and a duration of the removing b) are determined and user-controlled by a timer-relay/switch or two independent timer-relays/switches,
    wherein each of the durations are controlled independently of each other, or both are controlled by a trigger device which triggers upon certain process conditions being reached.

29. The method of claim 1, wherein the heat source is not fully turned off after the removing b), but wherein the heat source is reduced in its heating action so as to modulate a cooling behaviour of the substrate thereby controlling and preventing the formation of a thermal stress inside the substrate.

30. The method of claim 1, wherein a flow of gas which is heated to a temperature in the range of from 100° C. to 800° C. is directed at the substrate at a region where the removing b) is performed,
    wherein the direction of the flow of gas occurs at a time selected from the group consisting of before, during and after the removing b).

31. The method of claim 1, wherein one of the two electrodes is formed or surrounded by a secondary heat source, wherein the secondary heat source heats and maintains the substrate at a temperature in the range of from 50° C. to 900° C.

32. The method of claim 1, wherein the two electrodes are connected to a capacitor having a capacitance from 50-200000 pF, connected to the voltage source.

33. The method of claim 1, wherein the substrate has a thickness of from 0.1 mm to 10 mm.

34. The method of claim 1, wherein each of the two electrodes are placed at a distance of from 0.2 mm to 25 mm from the substrate.

35. The method of claim 1, wherein the substrate is moved relative to the two electrodes and the heat source, wherein a relative movement occurs at a one or more time selected from the group consisting of during the melting a), during the removing b) and after the removing b).

36. The method of claim 35, wherein, after the relative movement of the substrate, the melting a) and the removing b) are repeated.

37. The method of claim 35, wherein the relative movement of the substrate and the melting a) and the removing b) are repeated n times, n+1 denoting the number of holes or recesses or wells or blind holes in an array being formed.

38. A structure in a substrate generated by the method of claim 1, wherein the structure comprises an array of holes or recesses or wells, and wherein the holes or recesses or wells have a distance between them which is <500 μm.

39. The method of claim 17, wherein the high frequency high voltage has an amplitude in the range of from 100 V to 100 kV and has a frequency in the range of from 10 kHz to 1 GHz and is applied for a time period in the range of from 0.1 ms to 5 s.

40. The method of claim 20, wherein the DC voltage is defined in claim 8.

41. The method of claim 21, wherein the laser pulse is applied at the same region b1) as the region a1).

42. The method of claim 21, wherein the DC voltage is applied for a time period in the range of from 0.1 ms to 10 s.

43. The method of claim 35, wherein the substrate is moved by a defined distance.

44. A method of generating a structure in a substrate, comprising the following a) and b) in order:
    a) melting a volume of material of a substrate, which is electrically insulating or semiconducting at room temperature, by heating the volume of material with a heat source to form a molten volume, wherein the volume of material extends fully from a first surface of the substrate to a second surface of the substrate, and the second surface is opposite of the first surface;
    b) removing the molten volume by applying a voltage across the substrate with two electrodes connected to a voltage source and placed at a distance from, and on opposite sides of, the substrate, wherein the removing b) is initiated once the volume of material is molten,
    thereby generating the structure in the substrate, wherein the structure comprises at least one hole, recess, well, or array thereof, and
    wherein the heat source is selected from the group consisting of:
    at least one laser;
    a heating element;
    a heated electrode;
    a gas flame; and
    a combination of such heat sources.

* * * * *